(12) United States Patent
Fukunaga et al.

(10) Patent No.: US 6,709,513 B2
(45) Date of Patent: Mar. 23, 2004

(54) SUBSTRATE INCLUDING WIDE LOW-DEFECT REGION FOR USE IN SEMICONDUCTOR ELEMENT

(75) Inventors: Toshiaki Fukunaga, Kaisei-machi (JP); Toshiaki Kuniyasu, Kaisei-machi (JP); Mitsugu Wada, Kaisei-machi (JP); Yoshinori Hotta, Shizuoka-ken (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 77 days.

(21) Appl. No.: 10/188,038

(22) Filed: Jul. 3, 2002

(65) Prior Publication Data
US 2003/0006211 A1 Jan. 9, 2003

(30) Foreign Application Priority Data

| Jul. 4, 2001 | (JP) | ......................... 2001-203489 |
| Jul. 4, 2001 | (JP) | ......................... 2001-203491 |
| Feb. 1, 2002 | (JP) | ......................... 2002-025214 |
| Jun. 7, 2002 | (JP) | ......................... 2002-167234 |

(51) Int. Cl.⁷ ............................. C30B 25/04

(52) U.S. Cl. .............. 117/90; 117/94; 117/95; 117/97; 117/106; 117/952

(58) Field of Search ............... 117/94, 95, 97, 117/106, 90, 952

(56) References Cited

U.S. PATENT DOCUMENTS 5,716,588 A * 2/1998 Vergani et al.

FOREIGN PATENT DOCUMENTS

EP   1276140   * 1/2003

* cited by examiner

Primary Examiner—Robert Kunemund
(74) Attorney, Agent, or Firm—Sughrue Mion, PLLC

(57) ABSTRACT

In a process for producing a substrate for use in a semiconductor element: a porous anodic alumina film having a great number of minute pores is formed on a surface of a base substrate; the surface of the base substrate is etched by using the porous anodic alumina film as a mask so as to form a great number of pits on the surface of the base substrate; the porous anodic alumina film is removed; and a GaN layer is formed on the surface of the base substrate by crystal growth.

24 Claims, 13 Drawing Sheets

SUBSTRATE INCLUDING WIDE LOW-DEFECT REGION FOR USE IN SEMICONDUCTOR ELEMENT

BACKGROUND OF THE INVENTION

1. Field of the Invention

The present invention relates to a substrate which is used in a semiconductor element. The present invention also relates to a process for producing a substrate which is used in a semiconductor element. The present invention further relates to a semiconductor element which uses the above substrate.

2. Description of the Related Art

Japanese Journal of Applied Physics Vol. 37 (1998) Part 2, pp. L1020 discloses a short-wavelength semiconductor laser device which emits laser light in the 410 nm band. This semiconductor laser device is produced as follows. First, a GaN layer is formed on a sapphire substrate, a stripe pattern of a $SiO_2$ film is formed on the GaN layer, and a GaN thick film is formed by selective lateral growth. In the selective lateral growth, stripe areas of the GaN layer which are not covered by the stripe pattern of the $SiO_2$ mask are used as nuclei of the growth. Then, a GaN substrate, which is called ELOG (epitaxial lateral overgrowth) substrate, is obtained by separating the sapphire substrate from the GaN thick film. Next, an n-type GaN buffer layer, an n-type InGaN crack prevention layer, an n-type AlGaN/GaN modulation doped superlattice cladding layer, an n-type GaN optical waveguide layer, an n-InGaN/InGaN multiple-quantum-well active layer, a p-type AlGaN carrier block layer, a p-type GaN optical waveguide layer, a p-type AlGaN/GaN modulation doped superlattice cladding layer, and a p-type GaN contact layer are formed on the GaN substrate.

In order to obtain a semiconductor laser device which is reliable in high output power operation, a portion of the substrate on which an optical waveguide is formed is required to be a low-defect region. In addition, in order to obtain a high output power semiconductor laser device, the semiconductor laser device is required to have a wide stripe structure. Therefore, in order to achieve high reliability in a high output power semiconductor laser device having a wide stripe structure, it is necessary to form the semiconductor laser device by using a GaN substrate including a wide low-defect region.

However, since the ELOG disclosed in Japanese Journal of Applied Physics Vol. 37 (1998) Part 2, pp. L1020 is formed by the selective lateral growth using as nuclei the stripe areas of the GaN layer which are not covered by the stripe pattern of the $SiO_2$ film, defects are suppressed in regions formed by growth on the GaN layer. However, since the density of the nuclei for growth is high, the spaces between the nuclei are bridged before the grown nuclei become large, and therefore the defect density in the bridged regions becomes high. That is, it is difficult to form a wide low-defect region. In addition, when the thickness of the GaN thick film is increased, the defect density is further increased, and therefore it is further difficult to form a wide low-defect region. Thus, for example, in oscillation in the fundamental transverse mode, the highest output power obtained by reliable semiconductor laser devices using the ELOG substrates is about 30 mW.

Further, generally, reliability of a semiconductor element in which semiconductor layers are formed on a substrate depends on the defect density in the substrate. Therefore, a substrate including a wide low-defect region is required for every type of semiconductor element.

SUMMARY OF THE INVENTION

An object of the present invention is to provide a substrate which is used in a semiconductor element, and in which the defect density is low in a wide region.

Another object of the present invention is to provide process for producing a substrate which is used in a semiconductor element, and in which the defect density is low in a wide region.

A further object of the present invention is to provide a semiconductor element which uses a GaN substrate in which the defect density is low in a wide region.

(1) According to the first aspect of the present invention, there is provided a process for producing a substrate for use in a semiconductor element, comprising the steps of: (a) forming on a surface of a base substrate a porous anodic alumina film having a plurality of minute pores; (b) etching the surface of the base substrate by using the porous anodic alumina film as a mask so as to form a plurality of pits on the surface of the base substrate; (c) removing the porous anodic alumina film; and (d) forming a GaN layer on the surface of the base substrate by crystal growth.

According to the second aspect of the present invention, there is provided a process for producing a substrate for use in a semiconductor element, comprising the steps of: (a) forming on a surface of a base substrate a porous anodic alumina film having a plurality of minute pores; (b) etching the surface of the base substrate by using the porous anodic alumina film as a mask so that a plurality of pits are formed on the surface of the base substrate and the porous anodic alumina film is etched off; and (c) forming a GaN layer on the surface of the base substrate by crystal growth.

(2) The processes according to the first and second aspects of the present invention may have the following additional features.

(i) In each of the processes according to the first and second aspects of the present invention, it is preferable that the GaN layer is formed on the surface of the base substrate so that the plurality of pits are partially filled with the GaN layer and a plurality of spaces are left in the plurality of pits.

Alternatively, the GaN layer may be formed on the surface of the base substrate so that the plurality of pits are fully filled with the GaN layer i.e., no space is left in the plurality of pits.

(ii) The GaN layer can be formed by crystal growth so as to partially fill the plurality of pits when the depths of the plurality of pits are appropriately determined in consideration of the diameters and the total area of the plurality of pits. Specifically, the depths of the plurality of pits are preferably 300 nm or greater, and more preferably 500 nm or greater.

(iii) As disclosed in Japanese Journal of Applied Physics Vol. 35 (1996) Part 2, pp. L126, the porous anodic alumina film is an alumina film having a great number of minute pores which is obtained by selectively etching off bottom portions of an alumina film by anodic oxidation so that the great number of minute pores (perforation holes) are formed. The porous anodic alumina film having a great number of minute pores can be obtained by forming an aluminum thin film on a base substrate, and anodizing the aluminum thin film. Alternatively, the porous anodic alumina film having a great number of minute pores can be separately produced, and placed on the base substrate.

(iv) For the purpose of decreasing the defect density by control of the density of the nuclei for growth, and suppressing the occurrence of defects in the bridge regions between the nuclei, the diameters of the minute pores arranged on the surface of the base substrate are preferably 10 to 400 nm. In addition, for a similar purpose, it is preferable that the total area of the minute pores occupies 50 to 90% of the entire surface of the base substrate.

(v) The process according to each of the first and second aspects of the present invention may further comprise an additional step of forming as an uppermost layer a conductive GaN layer which is doped with a conductive impurity.

(vi) The process according to each of the first and second aspects of the present invention may further comprise an additional step of removing the base substrate. Further, all of the layers other than the uppermost layer may be removed. For example, after the conductive GaN layer is formed as the uppermost layer, all of the layers from the base substrate to the GaN layer under the conductive GaN layer may be removed so that the conductive GaN layer is obtained as a substrate for use in a semiconductor element.

(vii) Preferably, a portion of the base substrate including the surface of the base substrate, on which the porous anodic alumina film is formed, is made of one of GaN, sapphire, SiC, ZnO, $LiGaO_2$, $LiAlO_2$, $ZrB_2$, GaAs, GaP, Ge, and Si. For example, the entire base substrate may be made of one of GaN, sapphire, SiC, ZnO, $LiGaO_2$, $LiAlO_2$, $ZrB_2$, GaAs, GaP, Ge, and Si. Alternatively, the base substrate may be constituted by a main portion made of one of GaN, sapphire, SiC, ZnO, $LiGaO_2$, $LiAlO_2$, $ZrB_2$, GaAs, GaP, Ge, and Si, and a GaN layer formed on the main portion.

(3) According to the third aspect of the present invention, there is provided a semiconductor element comprising a substrate and semiconductor layers formed on the substrate. The substrate includes: a base substrate having a surface on which a plurality of pits are formed by etching using a porous anodic alumina film having a plurality of pores as a mask; and a GaN layer formed on the surface of the base substrate by crystal growth.

According to the fourth aspect of the present invention, there is provided a semiconductor element comprising a substrate and semiconductor layers formed on the substrate. The substrate is produced by forming a plurality of pits on a surface of a base substrate by etching using a porous anodic alumina film having a plurality of pores as a mask, forming a GaN layer on the surface of the base substrate by crystal growth, and removing the base substrate so as to leave the GaN layer as the substrate.

In the substrate according to each of the fourth aspect of the present invention, all of the layers from the base substrate to an arbitrary layer under the uppermost layer may be removed.

According to the fifth aspect of the present invention, there is provided a semiconductor element comprising a substrate and semiconductor layers formed on the substrate. The substrate is produced by forming at least one first GaN layer on the base substrate, forming on the at least one first GaN layer a second GaN layer which is doped with a conductive impurity, and removing the base substrate and the at least one first GaN layer so as to leave the second GaN layer as the substrate. Before each of the at least one first GaN layer is formed on a surface of one of the base substrate and the at least one first GaN layer located under each of the at least one first GaN layer, a plurality of pits are formed on the surface by etching using a porous anodic alumina film having a plurality of pores as a mask.

(4) According to the sixth aspect of the present invention, there is provided a substrate for use in a semiconductor element, comprising: a base substrate having a surface on which a plurality of pits are formed by etching using a porous anodic alumina film; and a GaN layer formed on the surface of the base substrate so that the plurality of pits are partially filled with the GaN layer and a plurality of spaces are left in the plurality of pits.

According to the seventh aspect of the present invention, there is provided a substrate for use in a semiconductor element, comprising: a base substrate having a surface on which a plurality of pits are formed by etching using a porous anodic alumina film; and a GaN layer formed on the surface of the base substrate so that the plurality of pits are fully filled with the GaN layer.

(5) The advantages of the present invention are as follows.

(i) In the process according to the first aspect of the present invention, a porous anodic alumina film having a great number of minute pores is formed on a surface of a base substrate, and the surface of the base substrate is etched by using the porous anodic alumina film as a mask so as to form a great number of pits on the surface of the base substrate. Then, the porous anodic alumina film is removed, and a GaN layer is formed on the surface of the base substrate by crystal growth. Therefore, the density of the nuclei for growth can be reduced compared with the conventional techniques, and thus it is possible to form a GaN layer including a wide low-defect region.

If, as in the cases of the conventional techniques, the GaN layer is formed by the selective lateral growth using the stripe areas as nuclei for growth, the spaces between the nuclei are bridged before the grown nuclei become large since the density of the nuclei for growth is high. Therefore, the defect density in the bridged regions becomes high. On the other hand, since, in the process according to the first aspect of the present invention, the surface of the base substrate is etched by using the porous anodic alumina film, a great number of minute pits can be formed on the surface of the base substrate, and the GaN layer is grown from the surface of the base substrate other than the minute pits. Thus, the density of the nuclei for growth can be reduced. In addition, since the unetched portions of the surface of the GaN layer other than the plurality of pits are connected to each other, lattice plane inclination which occurs when a crystal is largely grown from a nucleus for growth can be reduced, and defects in the bridged portions can also be reduced. Consequently, it is possible to form a GaN layer including a wide low-defect region. Further, even when the thickness of the GaN layer is increased, it is possible to obtain a GaN layer including a wide low-defect region.

Since a GaN layer including a wide low-defect region can be obtained, it is possible to obtain highly reliable semiconductor element by using a substrate produced by the process according to the first aspect of the present invention.

(ii) In the process according to the second aspect of the present invention, a porous anodic alumina film having a great number of minute pores is formed on a surface of a base substrate, and the surface of the base substrate is etched by using the porous anodic alumina film as a mask so that a great number of pits are formed on the surface of the base substrate and the porous anodic alumina film is etched off. Then, a GaN layer is formed on the surface of the base substrate by crystal growth. Therefore, it is possible to form a GaN layer including a wide low-defect region for a similar reason to the process according to the first aspect of the present invention.

In particular, in the process according to the second aspect of the present invention, the porous anodic alumina film which is used as a mask is removed at the same time as the formation of the plurality of minute pits on the surface of the base substrate. That is, the step for removing the porous anodic alumina film can be dispensed with, and the production process can be simplified.

(iii) Since a GaN layer including a wide low-defect region can be obtained by the process according to the first or second aspect of the present invention, it is possible to obtain highly reliable semiconductor element by using a substrate produced by the process according to the first or second aspect of the present invention.

(iv) When the diameters of the minute pores arranged on the surface of the base substrate are 10 to 400 nm, and the total area of the minute pores is 50 to 90% of the area of the surface of the base substrate, the density of the nuclei for growth can be more effectively reduced.

(v) When a conductive GaN layer which is doped with a conductive impurity is formed as an uppermost layer, a substrate having a further lower defect density can be produced for use in a semiconductor element. Therefore, for example, a dark current in a light receiving element can be reduced, and the performance of an electronic device or the like can be improved.

(vi) When the conductive GaN layer is formed as the uppermost layer, and thereafter all of the layers from the base substrate to the GaN layer under the conductive GaN layer is removed so that the conductive GaN layer is obtained as a substrate for use in a semiconductor element, and a semiconductor element such as a semiconductor laser device is produced by forming semiconductor layers including an active layer and the like on the substrate, an electrode can be formed on a back surface of the substrate, and therefore the process for producing the semiconductor element can be simplified.

(vii) The substrate according to the fifth aspect of the present invention comprises a base substrate having a surface on which a plurality of pits are formed by etching using a porous anodic alumina film, and a GaN layer formed on the surface of the base substrate so that the plurality of pits are partially filled with the GaN layer. Since the GaN layer formed on the surface of the base substrate on which the plurality of pits are formed by etching using the porous anodic alumina film has a wide low-defect region, a highly reliable semiconductor element can be produced by using the substrate according to the fifth aspect of the present invention.

In addition, since a plurality of spaces are left in the plurality of pits, it is possible to relax distortion or the like which is caused by the difference in thermal expansion between the substrate and the GaN layer when the temperature rises or falls, and suppress the occurrence of defects which are produced by the distortion.

(viii) The substrate according to the sixth aspect of the present invention comprises a base substrate having a surface on which a plurality of pits are formed by etching using a porous anodic alumina film, and a GaN layer formed on the surface of the base substrate so that the plurality of pits are fully filled with the GaN layer. Since the GaN layer formed on the surface of the base substrate on which the plurality of pits are formed by etching using the porous anodic alumina film has a wide low-defect region, a highly reliable semiconductor element can be produced by using the substrate according to the sixth aspect of the present invention.

DESCRIPTION OF PREFERRED EMBODIMENTS

Embodiments of the present invention are explained in detail below with reference to drawings.

First Embodiment

Figure 1:
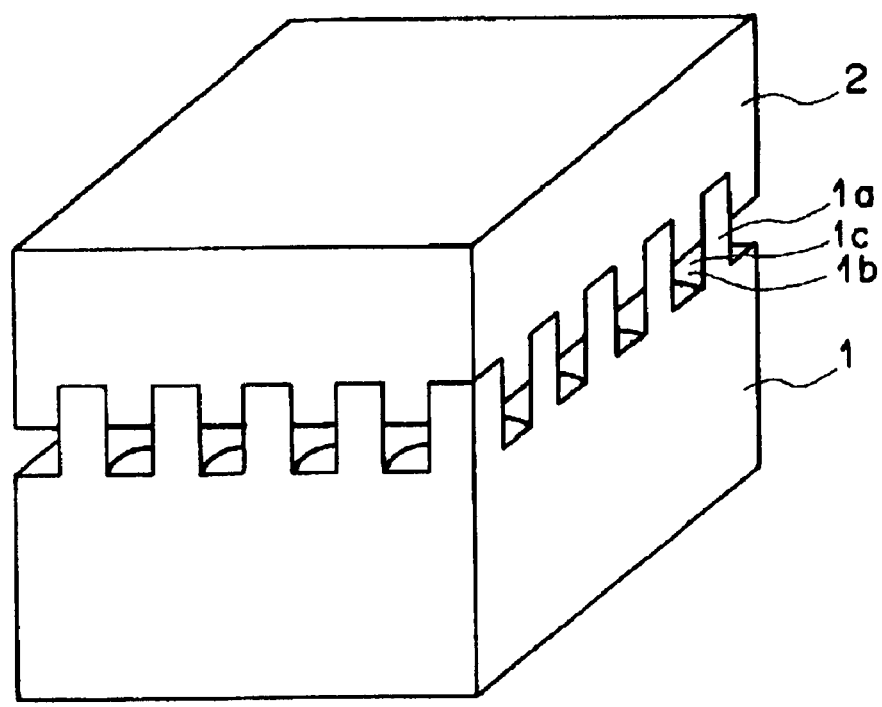
FIG. 1 is a diagrammatic perspective view of a substrate for use in a semiconductor element, as a first embodiment of the present invention.

FIG. 1 is a diagrammatic perspective view of a substrate for use in a semiconductor element, as the first embodiment of the present invention.

As illustrated in FIG. 1, the substrate for use in a semiconductor element, as the first embodiment of the present invention, comprises a base substrate 1 and a GaN layer 2. A plurality (great number) of minute pits 1b are formed on a surface of the base substrate 1 by etching using a porous anodic alumina film which has a plurality of minute pores, and the GaN layer 2 is formed on the surface of the base substrate 1 so that the plurality of minute pits 1b are partially filled with the GaN layer 2, and a plurality of spaces 1c are left in the plurality of minute pits 1b. The plurality of spaces 1c can be realized when the upper portions of the plurality of minute pits 1b are closed with the GaN layer 2 before the plurality of minute pits 1b are fully filled with the GaN layer 2.

Figure 2A:
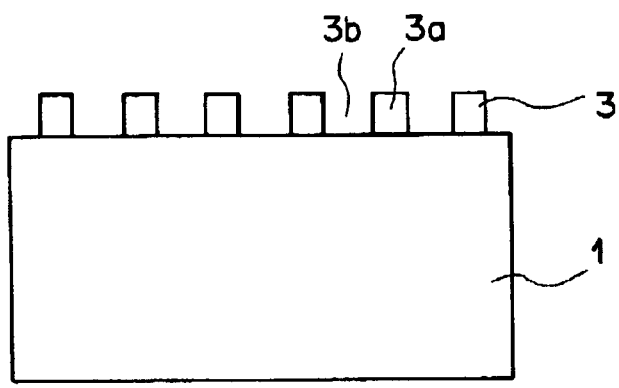
FIGS. 2A to 2C are cross-sectional views of structures in representative stages of a process for producing the substrate in the first embodiment of the present invention.
Figure 2B:
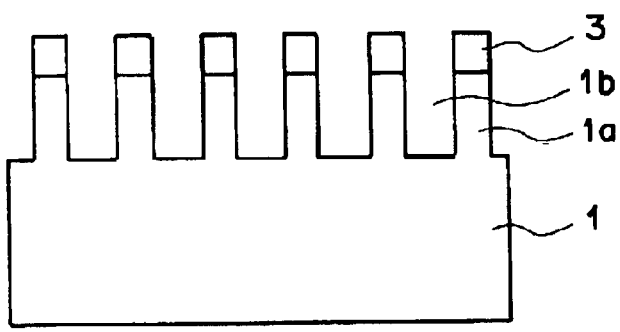
Figure 2C:
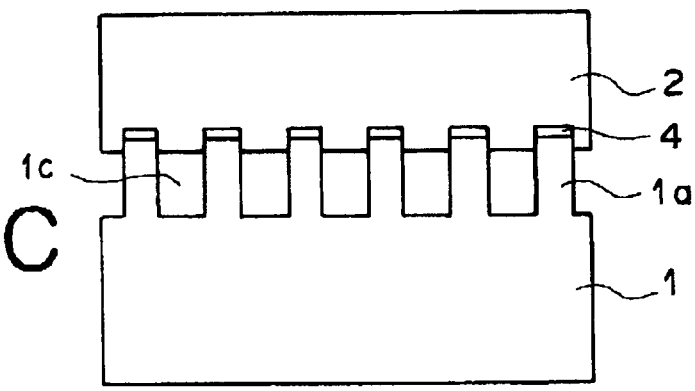

Next, a process for producing the substrate as the first embodiment of the present invention is explained below. FIGS. 2A to 2C are cross-sectional views of structures in representative stages of the process for producing the substrate in the first embodiment of the present invention.

First, as illustrated in FIG. 2A, a porous anodic alumina film 3 is formed on a surface of a base substrate 1 by anodic oxidation, where a plurality of minute pores each having a diameter of 10 to 400 nm are distributed in the porous anodic alumina film 3. The porous anodic alumina film 3 may be separately produced, and then placed on the surface of the base substrate 1. Alternatively, the porous anodic alumina film 3 may be realized on the surface of the base substrate 1 by first forming an aluminum film on the surface of the base substrate 1, and then anodizing the aluminum film. In the latter case, the porous anodic alumina film 3 can be formed, for example, as explained below.

First, an aluminum film having a thickness of about 0.5 micrometers is formed on the base substrate 1, and a plurality of minute pores each having a diameter of 10 to 400 nm are produced in the aluminum film by anodic oxidation. The anodic oxidation can be performed by fixing the base substrate 1 on which the aluminum film is formed and a counter electrode made of carbon with a gap of 10 mm in a solution of sulfuric acid, oxalic acid, chromic acid, and phosphoric acid, for example, a solution containing 15% sulfuric acid, 2% oxalic acid, and 3 to 4% phosphoric acid, maintaining the temperature at about 10° C., and applying a voltage of about 15 V between the base substrate 1 having the aluminum film as an anode and the carbon counter electrode as a cathode. When the type and concentration of the oxidizing solution, the gap between the base substrate 1 and the carbon counter electrode, the temperature, and the voltage are appropriately adjusted, the plurality of minute pores can be produced so that the diameters of the plurality of minute pores are 10 to 400 nm, and the total area of the plurality of minute pores is 50 to 90% of the total area of the base substrate 1. Although not shown, after the anodic oxidation, portions of the aluminum film which are not anodized remain on the base substrate side of the porous anodic alumina film 3 which is produced by the anodic oxidation.

Figure 3:
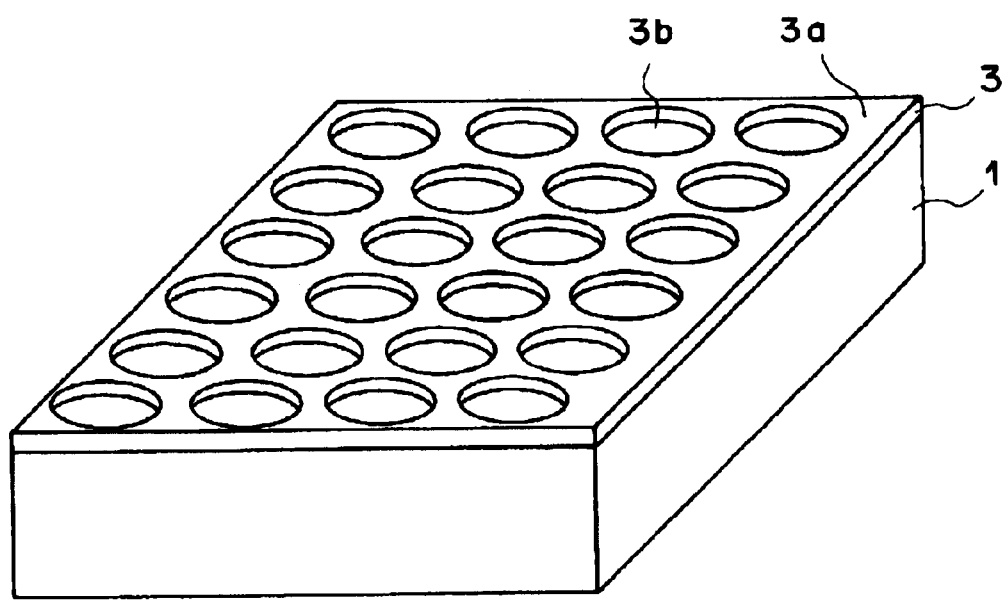
FIG. 3 is a diagrammatic perspective view of the structure in the stage in which a porous anodic alumina film is formed on a base substrate in the first embodiment of the present invention.

FIG. 3 is a diagrammatic perspective view of the structure in the stage in which the porous anodic alumina film is formed on the base substrate in the first embodiment of the present invention. The surface of the base substrate 1 is etched with mixture gas or the like which passes through the plurality of minute pores 3b of the porous anodic alumina film 3, where the portions of the porous anodic alumina film 3 other than the plurality of minute pores 3b behave as a mask.

FIG. 2B shows the stage in which the etching is completed. In the etching, a difference in the etching rate with respect to the mixture gas or the like between the base substrate 1 and the porous anodic alumina film 3 is utilized. That is, when the etching is performed for a duration which is shorter than the time necessary for etching off the porous anodic alumina film 3, portions of the base substrate 1 under the plurality of minute pores 3b of the porous anodic alumina film 3 are etched so as to form the plurality of minute pits 1b. At this time, the other portions of the base substrate 1 under the portions 3a of the alumina film other than the plurality of minute pores are not etched, and remain as a plurality of unetched portions 1a, which are connected to each other. A greater depth of the etching (i.e., greater depths of the plurality of minute pits 1b) is more preferable for relaxation of distortion which is caused by the difference in thermal expansion between the base substrate and the GaN layer when the temperature excessively rises or falls. Specifically, the depth of the etching equal to or greater than 300 nm is preferable, and the depth of the etching equal to or greater than 500 nm is more preferable.

Thereafter, the porous anodic alumina film 3 and the unanodized portion of the aluminum film are etched off with a solution of NaOH or the like. Then, as illustrated in FIG. 2C, a GaN layer 2 is grown in the lateral directions by using the plurality of unetched portions 1a as nuclei for growth. Preferably, in the crystal growth of the GaN layer, a GaN buffer layer 4 is first formed at low temperature, and then the GaN layer 2 is formed at high temperature.

In this process, the diameters of the plurality of minute pores 3b in the porous anodic alumina film are in the range from 10 to 400 nm, the nuclei for growth are produced on the plurality of unetched portions 1a which are formed by using the plurality of minute pores 3b in the porous anodic alumina film and connected to each other, and crystal growth of the GaN layer 2 proceeds from the nuclei for growth on the plurality of unetched portions 1a. Therefore, the density of the nuclei for growth can be reduced. In addition, since the plurality of unetched portions 1a are connected to each other, the lattice plane inclination which occurs when a crystal is largely grown from a nucleus for growth can be reduced, and the number of defects in the bridged portions can also be reduced. Consequently, it is possible to form the GaN layer 2 so as to include a wide low-defect region. Further, since the density of the nuclei for growth can be reduced, it is possible to reduce defects produced by distortion which is caused by lattice mismatch between the base substrate and the GaN layer.

Incidentally, when the GaN layer 2 is grown on the plurality of unetched portions 1a by selective lateral growth, it is considered that nuclei for growth are also grown in the plurality of minute pits 1b. However, the upper portions of the plurality of minute pits 1b are closed by the lateral growth from the nuclei for growth on the plurality of unetched portions 1a before the nuclei for growth in the plurality of minute pits 1b are grown. Therefore, the plurality of spaces 1c are left in the plurality of minute pits 1b, and effectively reduce the defects produced by distortion which is caused by lattice mismatch between the base substrate and the GaN layer.

Second Embodiment

Figure 4B:
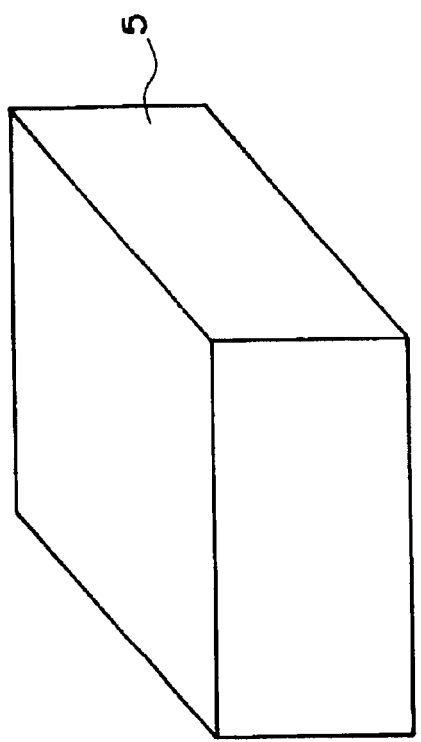
FIG. 4B is a diagrammatic perspective view of a substrate for use in a semiconductor element, as a variation of the second embodiment of the present invention.
Figure 4A:
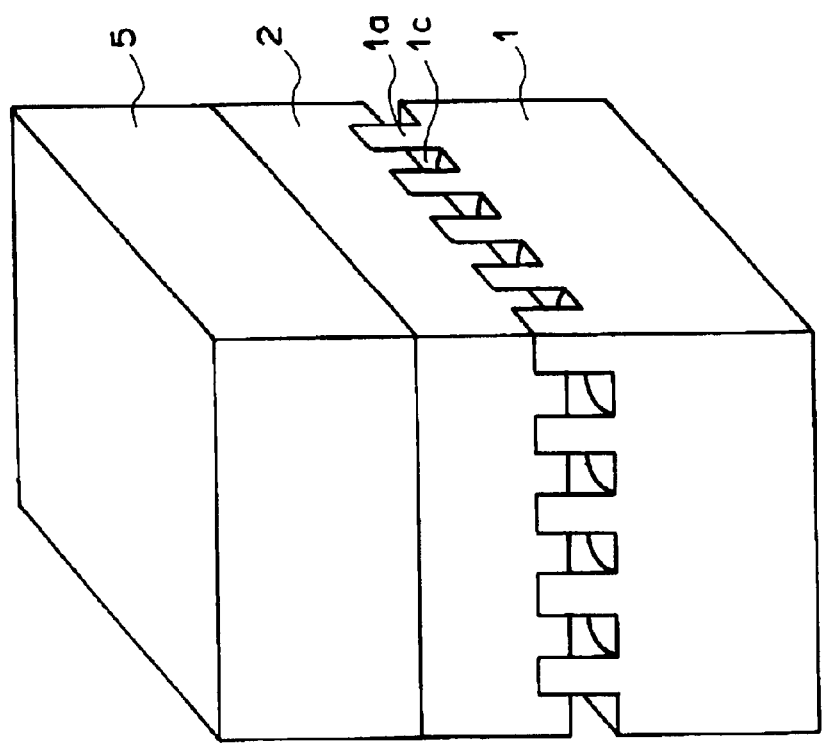
FIG. 4A is a diagrammatic perspective view of a substrate for use in a semiconductor element, as a second embodiment of the present invention.

FIG. 4A is a diagrammatic perspective view of a substrate for use in a semiconductor element, as the second embodiment of the present invention.

In the substrate of FIG. 4A, a conductive GaN layer 5 which is doped with a conductive impurity and has a thickness of about 100 to 200 micrometers is formed on the GaN layer 2 in the substrate of FIG. 2C. Therefore, a conductive substrate which is to be used in a semiconductor element and has a low defect density can be produced. Thus, when the substrate is used in a semiconductor element, for example, a dark current in a light receiving element can be reduced, and the performance of an electronic device or the like can be improved.

FIG. 4B is a diagrammatic perspective view of a substrate for use in a semiconductor element, as a variation of the second embodiment of the present invention. The substrate of FIG. 4B is produced by removing the base substrate 1 and the GaN layer 2 from the substrate of FIG. 4A. That is, only the conductive GaN layer 5 is used as a conductive substrate in a semiconductor element. When a semiconductor element such as a semiconductor laser device is produced by forming semiconductor layers including an active layer and the like on the conductive GaN substrate of FIG. 4B, an electrode can be formed on the back surface of the substrate, and therefore the process for producing the semiconductor element can be simplified.

Third Embodiment

Figure 5:
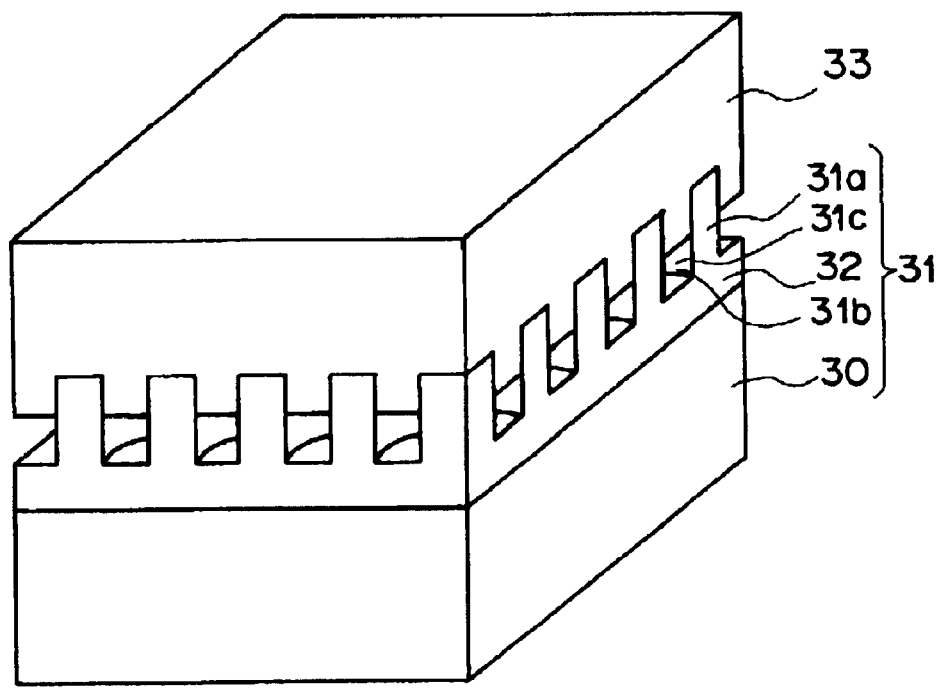
FIG. 5 is a diagrammatic perspective view of a substrate for use in a semiconductor element, as a third embodiment of the present invention.

FIG. 5 is a diagrammatic perspective view of a substrate for use in a semiconductor element, as the third embodiment of the present invention.

As in the case of the first embodiment, the substrate for use in a semiconductor element, as the third embodiment of the present invention, comprises a base substrate 31 and a GaN layer 33. A plurality (great number) of minute pits 31b are formed on a surface of the base substrate 31 by etching using a porous anodic alumina film which has a plurality of minute pores, and the GaN layer 33 is formed on the surface of the base substrate 31 so that the plurality of minute pits 31b are partially filled with the GaN layer 33, and a plurality of spaces 31c are left in the plurality of minute pits 31b. The plurality of spaces 31c can be realized when the upper portions of the plurality of minute pits 31b are closed with the GaN layer 33 before the plurality of minute pits 31b are fully filled with the GaN layer 33.

As illustrated in FIG. 5, the substrate as the third embodiment is different from the first embodiment in that the base substrate 31 is constituted by a main portion 30 and an upper portion 32 which is made of GaN and arranged on the main portion 30. The plurality (great number) of minute pits 31b are formed on a surface of the upper portion 32 of the base substrate 31 by the etching using the porous anodic alumina film which has the plurality of minute pores. Preferably, the main portion 30 is made of sapphire or SiC, which have a lattice constant relatively close to the lattice constant of GaN.

Figure 6A:
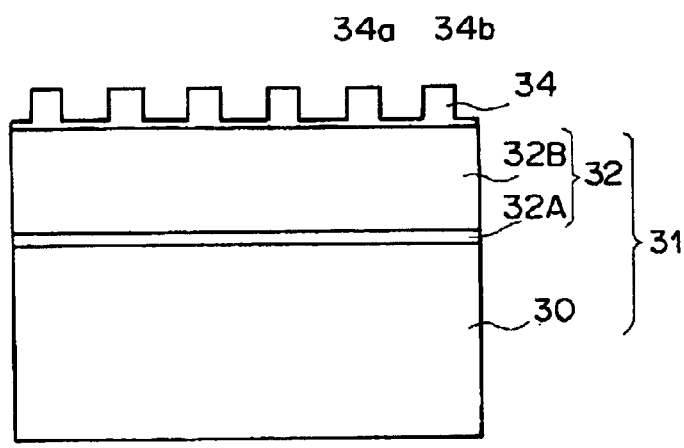
FIGS. 6A to 6C are diagrammatic cross-sectional views of structures in representative stages of a process for producing the substrate in the third embodiment of the present invention.
Figure 6B:
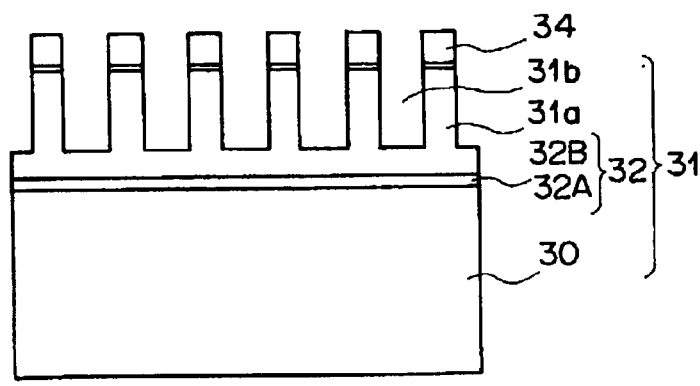
Figure 6C:
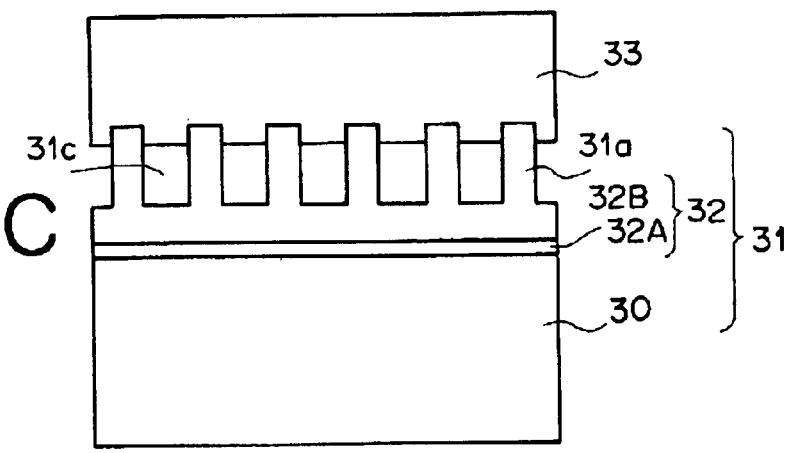

Next, a process for producing the substrate as the third embodiment of the present invention is explained below. FIGS. 6A to 6C are cross-sectional views of structures in representative stages of the process for producing the substrate in the third embodiment of the present invention.

First, as illustrated in FIG. 6A, a low-temperature GaN layer 32A is formed on the main portion 30 at low temperature, and then a GaN layer 32B is formed on the low-temperature GaN layer 32A at high temperature. Thus, the base substrate 31 is formed, where the low-temperature GaN layer 32A and the GaN layer 32B constitute the upper portion 32.

Next, a porous anodic alumina film 34 is formed on the upper portion 32 (i.e., the GaN layer 32B) of the base substrate 31, where a plurality of minute pores each having a diameter of 10 to 400 nm are arranged in the porous anodic alumina film 34.

The porous anodic alumina film 34 may be separately produced, and then placed on the surface of the base substrate 31. Alternatively, the porous anodic alumina film 34 may be realized on the surface of the base substrate 31 by first forming an aluminum film on the surface of the base substrate 31, and then anodizing the aluminum film. In the latter case, the porous anodic alumina film 34 can be formed, for example, as explained below.

First, an aluminum film having a thickness of about 0.5 micrometers is formed on the GaN layer 32B, and a plurality of minute pores each having a diameter of 10 to 400 nm are produced in the aluminum film by anodic oxidation. The anodic oxidation can be performed by fixing the upper portion 32 on which the aluminum film is formed and a counter electrode made of carbon with a gap of 10 mm in a solution of sulfuric acid, oxalic acid, and phosphoric acid, for example, a solution containing 15% sulfuric acid, 2% oxalic acid, and 3 to 4% phosphoric acid, maintaining the temperature at about 10° C., and applying a voltage of about 15 V between the GaN layer 32B having the aluminum film as an anode and the carbon counter electrode as a cathode. When the type and concentration of the oxidizing solution, the gap between the GaN layer 32B and the carbon counter electrode, the temperature, and the voltage are appropriately adjusted, the plurality of minute pores can be produced so that the diameters of the plurality of minute pores are 10 to 400 nm, and the total area of the plurality of minute pores is 50 to 90% of the total area of the GaN layer 32B. After the anodic oxidation, portions of the aluminum film which are not anodized remain on the base substrate side of the porous anodic alumina film 34 which is produced by the anodic oxidation.

Figure 7:
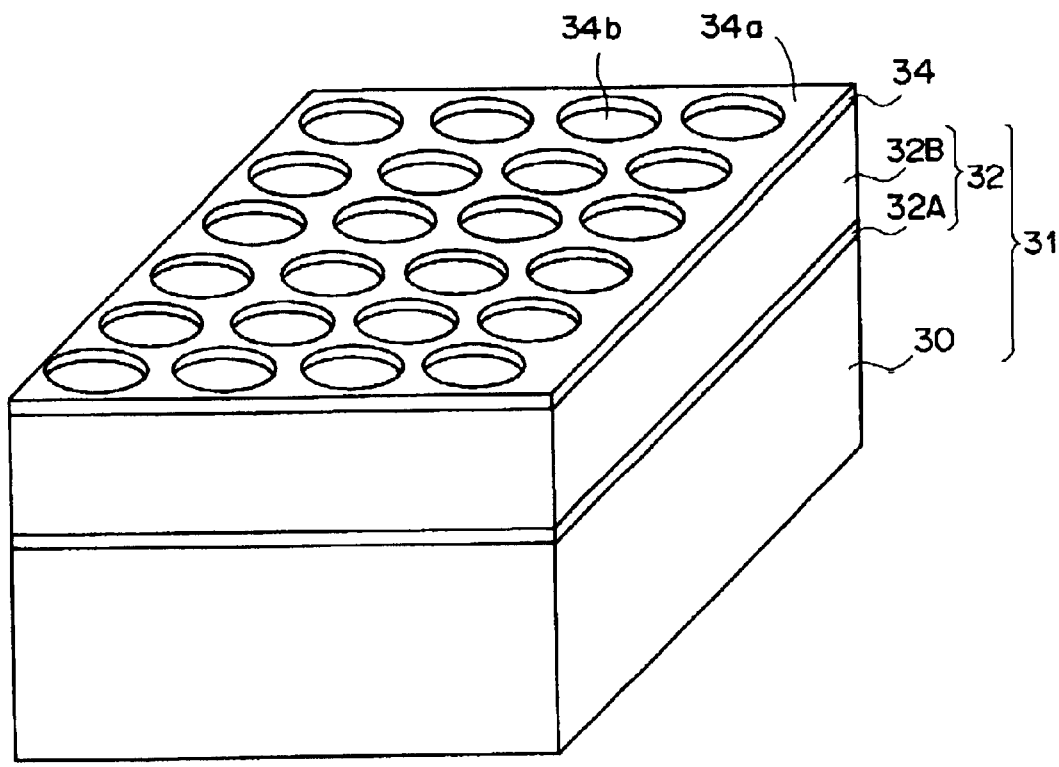
FIG. 7 is a diagrammatic perspective view of the structure in the stage in which a porous anodic alumina film is formed on a base substrate in the third embodiment of the present invention.

FIG. 7 is a diagrammatic perspective view of the structure in the stage in which the porous anodic alumina film is formed on the base substrate in the third embodiment of the present invention. The surface of the GaN layer 32B is etched with mixture gas or the like which passes through the plurality of minute pores 34b of the porous anodic alumina film 34, where the portions of the porous anodic alumina film 34 other than the plurality of minute pores 34b behave as a mask.

FIG. 6B shows the stage in which the etching is completed. In the etching, a difference in the etching rate with respect to the mixture gas or the like between the porous anodic alumina film 34, the unanodized portions of the aluminum film under the porous anodic alumina film 34, and the GaN layer 32B is utilized. That is, when constant-rate etching is performed until a thin film portion of the alumina film at the bottom of each of the plurality of minute pits 31b is removed, the unanodized aluminum film is exposed at the bottom of each pit. For example, in the case of dry etching using chlorine gas, the etching rates of the unanodized aluminum film and the GaN layer 32B are higher than the etching rates of the porous anodic alumina film. Therefore, the unanodized aluminum film and the GaN layer 32B can be etched in a shorter time than the time necessary for etching off the porous anodic alumina film. Therefore, portions of the GaN layer 32B under the plurality of minute pores 34b of the porous anodic alumina film 34 are etched so as to form the plurality of minute pits 31b, and the other portions of the GaN layer 32B under the portions of the alumina film other than the plurality of minute pores are not etched, and remain as a plurality of unetched portions 31a. The plurality of unetched portions 31a are connected to each other. A greater depth of the etching (i.e., greater depths of the plurality of minute pits 31b) is more preferable for relaxation of distortion which is caused by the difference in thermal expansion between the base substrate and GaN when the temperature excessively rises or falls. Specifically, the depth of the etching equal to or greater than 300 nm is preferable, and the depth of the etching equal to or greater than 500 nm is more preferable.

Thereafter, the porous anodic alumina film 34 and the unanodized portion of the aluminum film are etched off with a solution of NaOH or the like. Then, as illustrated in FIG. 6C, an upper GaN layer 33 is grown in the lateral directions by using the plurality of unetched portions 31a as nuclei for growth.

In this process, the diameters of the plurality of minute pores 34b in the porous anodic alumina film are in the range from 10 to 400 nm, the nuclei for growth are produced on the plurality of unetched portions 31a which are formed by using the plurality of minute pores 34b in the porous anodic alumina film and connected to each other, and crystal growth of the upper GaN layer 33 proceeds from the nuclei for growth on the plurality of unetched portions 31a. Therefore, the density of the nuclei for growth can be reduced. In addition, since the plurality of unetched portions 31a are connected to each other, the lattice plane inclination which occurs when a crystal is largely grown from a nucleus for growth can be reduced, and defects in the bridged portions can also be reduced. Consequently, it is possible to form the upper GaN layer 33 so as to include a wide low-defect region. Further, since the density of the nuclei for growth can be reduced, it is possible to reduce defects produced by distortion which is caused by lattice mismatch between the base substrate and the upper GaN layer 33.

Incidentally, when the upper GaN layer 33 is grown on the plurality of unetched portions 31a by selective lateral growth, it is considered that nuclei for growth are also grown in the plurality of minute pits 31b. However, the upper portions of the plurality of minute pits 31b are closed by the lateral growth from the nuclei for growth on the plurality of unetched portions 31a before the nuclei for growth in the plurality of minute pits 31b are grown. Therefore, the plurality of spaces 31c are left in the plurality of minute pits 31b, and effectively reduce the defects produced by distortion which is caused by lattice mismatch between the base substrate and the upper GaN layer 33.

Fourth Embodiment

Figure 8:
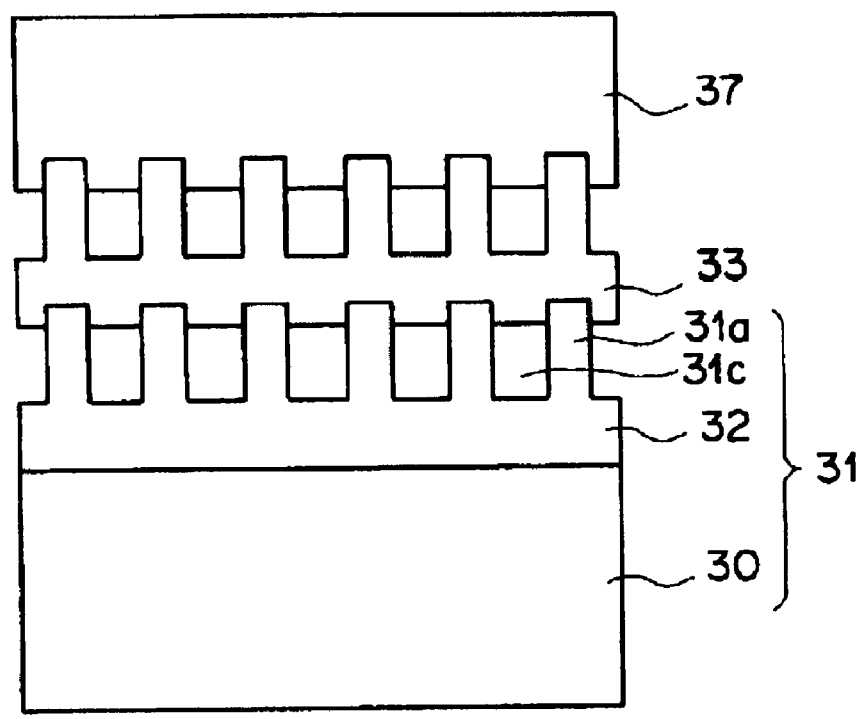
FIG. 8 is a diagrammatic cross-sectional view of a substrate for use in a semiconductor element, as a fourth embodiment of the present invention.

FIG. 8 is a diagrammatic cross-sectional view of a substrate for use in a semiconductor element, as the fourth embodiment of the present invention.

In the substrate as the fourth embodiment, a plurality of minute pits are formed on the upper surface of the upper GaN layer 33 in the substrate as the third embodiment, and a further GaN layer 37 is formed on the upper GaN layer 33. In order to produce the plurality of minute pits on the upper surface of the upper GaN layer 33, another (second) porous anodic alumina film having a plurality of minute pores is formed on the upper surface of the upper GaN layer 33, a plurality of minute pits are formed on the upper surface of the upper GaN layer 33 by etching using the second porous anodic alumina film as a mask, and the second porous anodic alumina film is removed. Thereafter, the GaN layer 37 is formed on the upper surface of the upper GaN layer 33.

When production of a plurality of minute pits on an upper surface of an uppermost GaN layer of a substrate and formation of another GaN layer on the upper surface of the uppermost GaN layer by selective lateral growth are repeated, it is possible to obtain a GaN layer in which defects are further reduced.

Fifth Embodiment

Figure 9:
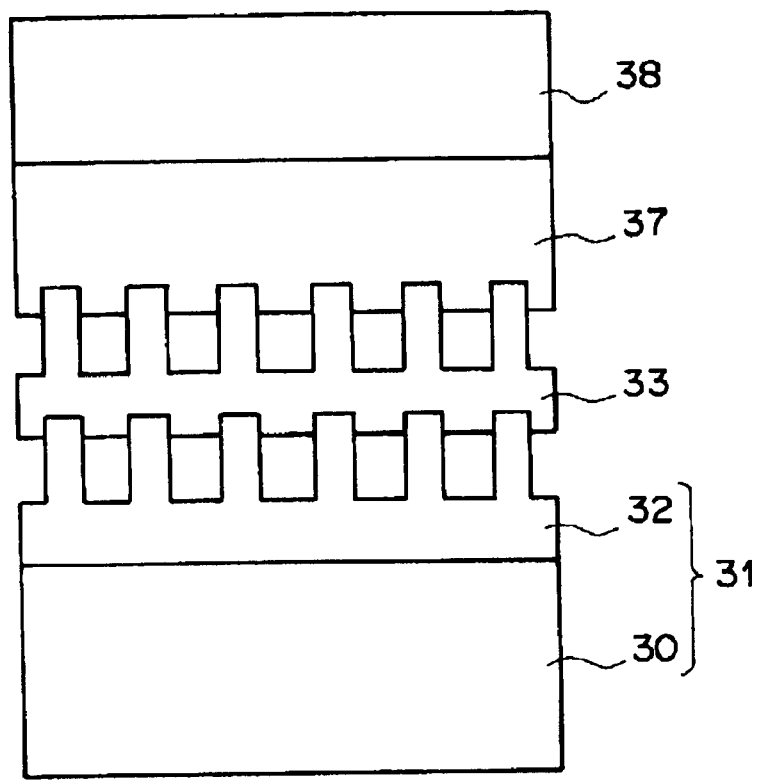
FIG. 9 is a diagrammatic cross-sectional view of a substrate for use in a semiconductor element, in a fifth embodiment of the present invention.

FIG. 9 is a diagrammatic cross-sectional view of a substrate for use in a semiconductor element, in the fifth embodiment of the present invention.

In the substrate of FIG. 9, a conductive GaN layer 38 which is doped with a conductive impurity and has a thickness of about 100 to 200 micrometers is formed on the GaN layer 37 in the substrate as the fourth embodiment. When a conductive GaN layer is formed as an uppermost layer as illustrated in FIG. 9, it is possible to produce a conductive substrate which is to be used in a semiconductor element and has a lower defect density.

It is possible to obtain as a substrate only the conductive GaN layer 38 in the substrate of FIG. 9. In order to obtain the conductive GaN layer 38 as a substrate, the layers from the base substrate 31 to the GaN layer 37 are removed from the substrate of FIG. 9. When a semiconductor element such as a semiconductor laser device is produced by forming semiconductor layers including an active layer and the like on the substrate constituted by only the conductive GaN layer 38, an electrode can be formed on the back surface of the substrate, and therefore the process for producing the semiconductor element can be simplified.

Sixth Embodiment

Figure 10A:
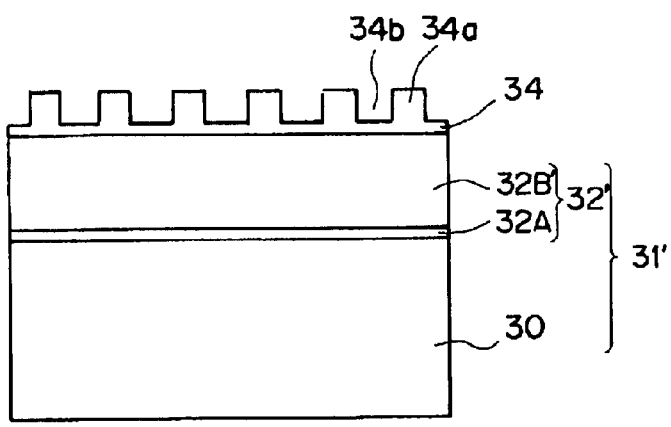
FIGS. 10A to 10C are diagrammatic cross-sectional views of structures in representative stages of a process for producing the substrate in a sixth embodiment of the present invention.
Figure 10B:
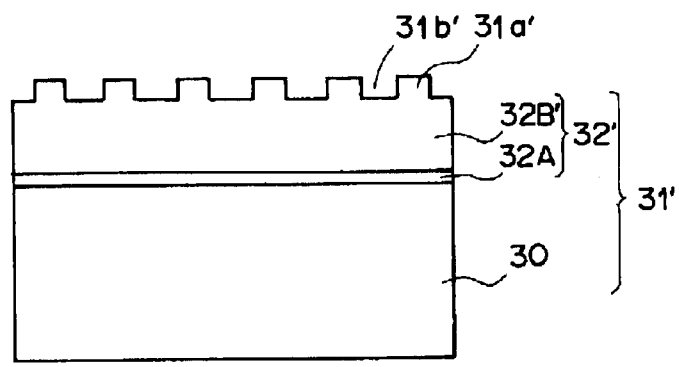
Figure 10C:
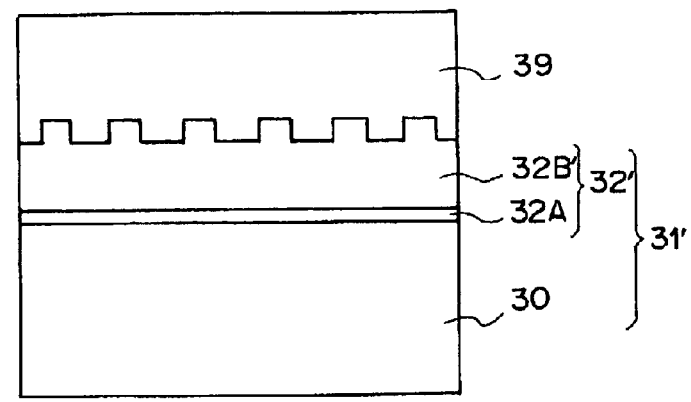

FIGS. 10A to 10C are diagrammatic cross-sectional views of structures in representative stages of a process for producing the substrate in the sixth embodiment of the present invention.

The substrate for use in a semiconductor element, as the sixth embodiment of the present invention, comprises a base substrate 31' and a GaN layer 39. As in the case of the third embodiment, a plurality (great number) of minute pits 31b' are formed on a surface of the base substrate 31' by etching using a porous anodic alumina film which has a plurality of minute pores, and the GaN layer 39 is formed on the surface of the base substrate 31'. The substrate as the sixth embodiment is different from the third embodiment in that the plurality of minute pits 31b' is fully filled with the upper GaN layer 39 as illustrated in FIG. 10C.

Next, a process for producing the substrate as the sixth embodiment of the present invention is explained below with reference to FIGS. 10A to 10C.

Since the stages of the process for producing the substrate as the sixth embodiment before the formation of an upper GaN layer are similar to the third embodiment, details of these stages are not repeated.

First, as illustrated in FIG. 10A, a low-temperature GaN layer 32A is formed on a main portion 30 of the base substrate 31' at low temperature, and then a GaN layer 32B' is formed on the low-temperature GaN layer 32A at high temperature. Next, a porous anodic alumina film 34 is formed on the GaN layer 32B', where a plurality of minute pores each having a diameter of 10 to 400 nm are arranged in the porous anodic alumina film 34. Thus, the structure in this stage is identical to the structure illustrated in FIG. 7. Thereafter, the surface of the GaN layer 32B' is etched with mixture gas or the like which passes through the plurality of minute pores 34b of the porous anodic alumina film 34, where the portions of the porous anodic alumina film 34 other than the plurality of minute pores 34b behave as a mask.

FIG. 10B shows the stage in which the etching is completed. In the etching, a difference in the etching rate with respect to the mixture gas or the like between the porous anodic alumina film 34, the unanodized portions of the aluminum film under the porous anodic alumina film, and the GaN layer 32B' is utilized. At this time, the etching condition is adjusted so that the pattern of the plurality of minute pores in the porous anodic alumina film 34 is automatically transferred to the GaN layer 32B' when the etching is continued until the porous anodic alumina film 34 and the unanodized portion of the aluminum film are etched off. Thus, a plurality of minute pits 31b' are formed in the portions of the GaN layer 32B' under the plurality of minute pores 34b of the porous anodic alumina film 34, and the other portions of the GaN layer 32B' under the portions of the alumina film other than the plurality of minute pores are not etched, and remain as a plurality of unetched portions 31a'. The plurality of unetched portions 31a' are connected to each other. The depth of the etching (i.e., the depths of the plurality of minute pits 31b') can be arbitrarily changed by adjusting the thickness of the aluminum film before the anodic oxidation. The depth of the etching can also be changed by the etching condition, e.g., the etchant composition, temperature, pressure, or the like.

Thereafter, as illustrated in FIG. 10C, an upper GaN layer 39 is grown in the lateral directions by using the plurality of unetched portions 31a' as nuclei for growth.

In this process, the diameters of the plurality of minute pores 34b in the porous anodic alumina film are in the range from 10 to 400 nm, the nuclei for growth are produced on the plurality of unetched portions 31a' which are formed by using the plurality of minute pores 34b in the porous anodic alumina film and connected to each other, and crystal growth of the upper GaN layer 39 proceeds from the nuclei for growth on the plurality of unetched portions 31a'. Therefore, the density of the nuclei for growth can be reduced. In addition, since the plurality of unetched portions 31a' are connected to each other, the lattice plane inclination which occurs when a crystal is largely grown from a nucleus for growth can be reduced, and defects in the bridged portions can also be reduced. Consequently, it is possible to form the upper GaN layer 39 so as to include a wide low-defect region. Further, since the density of the nuclei for growth can be reduced, it is possible to reduce defects produced by distortion which is caused by lattice mismatch between the base substrate and the upper GaN layer 39.

In the process in the sixth embodiment, the etching condition is determined so that the-porous anodic alumina film 34 and the unanodized portion of the aluminum film are etched off during the formation of the plurality of minute pits 31b' on the GaN layer 32B'. Therefore, a step for removing the porous anodic alumina film 34 by wet etching or the like is unnecessary, while such a step is necessary in the process in the first embodiment. Thus, the production process can be simplified.

It is possible to change or modify the process in the sixth embodiment as follows.

(i) In the process in the sixth embodiment, the plurality of minute pits 31b' are fully filled with the upper GaN layer 39. However, the depths of the minute pits 31b' in the GaN layer 32B' may be further increased so that spaces are left in the plurality of minute pits 31b'. In this case, the spaces relax the distortion produced between the base substrate 31' and the upper GaN layer 39, and therefore the quality of the substrate produced by the process in the sixth embodiment of the present invention can be further improved.

(ii) In addition, a plurality of minute pits may also be formed on the upper surface of the upper GaN layer 39 in the substrate as the sixth embodiment, and a further GaN layer 37 may be formed on the upper GaN layer 39. In order to produce the plurality of minute pits on the upper surface of the upper GaN layer 39, another (second) porous anodic alumina film having a plurality of minute pores can be formed on the upper surface of the upper GaN layer 39, and the plurality of minute pits can be formed on the upper surface of the upper GaN layer 39 by etching using the second porous anodic alumina film as a mask. After the second porous anodic alumina film is removed, the GaN layer 37 can be formed on the upper surface of the upper GaN layer 39.

When production of a plurality of minute pits on an upper surface of an uppermost GaN layer of a substrate and formation of another GaN layer on the upper surface of the uppermost GaN layer by selective lateral growth are repeated, it is possible to obtain a GaN layer in which defects are further reduced.

(iii) As in the case of the fifth embodiment, a conductive GaN layer which is doped with a conductive impurity and has a thickness of about 100 to 200 micrometers may be formed on the GaN layer 39 in the substrate as the sixth embodiment. When the conductive GaN layer is formed on the uppermost layer of the substrate as the sixth embodiment, it is possible to produce a conductive substrate which is to be used in a semiconductor element and has a lower defect density.

In addition, it is possible to obtain as a substrate only the conductive GaN layer in the above substrate in which the conductive GaN layer is formed. In order to obtain the conductive GaN layer as a substrate, the layers from the base substrate 31' to the GaN layer 39 can be removed from the substrate. When a semiconductor element such as a semiconductor laser device is produced by forming semiconductor layers including an active layer and the like on the substrate constituted by only the conductive GaN layer, an electrode can be formed on the back surface of the substrate, and therefore the process for producing the semiconductor element can be simplified.

Materials and Applications

In each of the first to sixth embodiments, the base substrate or the main portion of the base substrate can be made of one of GaN, sapphire, SiC, ZnO, $LiGaO_2$, $LiAlO_2$, $ZrB_2$, GaAs, GaP, Ge, and Si.

Since the defect density in the substrates according to the present invention is low, the substrates according to the present invention are reliable, and can be used in production of semiconductor elements and optical or electronic devices in the fields of high-speed, information processing, image processing, communications, laser measurement, medicine, printing, and the like, where the semiconductor elements and the optical or electronic devices include field effect transistors, semiconductor laser devices, semiconductor optical amplifiers, light emitting devices, optical detectors, and the like.

CONCRETE EXAMPLES

Concrete examples of the substrates according to the present invention, production processes of the substrates, and semiconductor elements using the substrates are explained below.

In the following concrete examples I to VII, materials used in the growth of the layers are trimethyl gallium (TMG), trimethyl aluminum (TMA), trimethyl indium (TMI), and ammonia. In addition, silane gas is used as n-type dopant gas, and cycropentadienyl magnesium ($CP_2Mg$) is used as p-type dopant gas.

Concrete Example I

The concrete example I is a concrete example of the substrate as the first embodiment of the present invention illustrated in FIG. 1.

First, an aluminum film having a thickness of about 0.5 micrometers is formed on a (0001) face of a base substrate 1 made of 6HSiC by EB (electron beam) evaporation. Then, the base substrate 1 on which the aluminum film is formed and a counter electrode made of carbon are fixed with a gap of 10 mm in a 15% sulfuric acid solution, the temperature is maintained at about 10° C., and a voltage of about 15 V is applied between the base substrate 1 having the aluminum film as an anode and the carbon counter electrode as a cathode, so that a porous anodic alumina film 3 having a plurality of minute pores 3b is formed on the base substrate 1, as illustrated in FIG. 2A, where the plurality of minute pores 3b have diameters of about 30 nm and a total area occupying about 70% of the entire area of the porous anodic alumina film 3. Thereafter, a plurality of minute pits 1b and a plurality of unetched portions 1a are produced on the surface of the base substrate 1 by etching the surface of the base substrate 1 with mixture gas of $CHF_3$ and oxygen in an RIE (reactive ion etching) system, as illustrated in FIG. 2B, where the depths of the plurality of minute pits 1b are about 1 micrometer.

Next, the porous anodic alumina film 3 is removed with a NaOH solution, and a low-temperature GaN buffer layer 4 having a thickness of about 20 nm is formed on the base substrate 1 having the plurality of unetched portions 1a at a temperature of 500° C. by organometallic vapor phase epitaxy. Subsequently, a GaN layer 2 is formed over the plurality of unetched portions 1a by organometallic vapor phase epitaxy, where crystal growth in the lateral directions is continued at 1,050° C. until the surface of the GaN layer 2 becomes even. Thus, a substrate for use in a semiconductor element is obtained.

The present inventors have measured the etch pit density of the substrate formed as above. In the measurement, the etch pit density is counted after the substrate is dipped in an etching solution. The measured etch pit density of the substrate as the concrete example I is $10^6$ to $10^7/cm^2$, which is three to four orders of magnitude smaller than the etch pit densities (about $10^{10}/cm^2$) of the substrates produced by the conventional production process.

Concrete Example II

Figure 11:
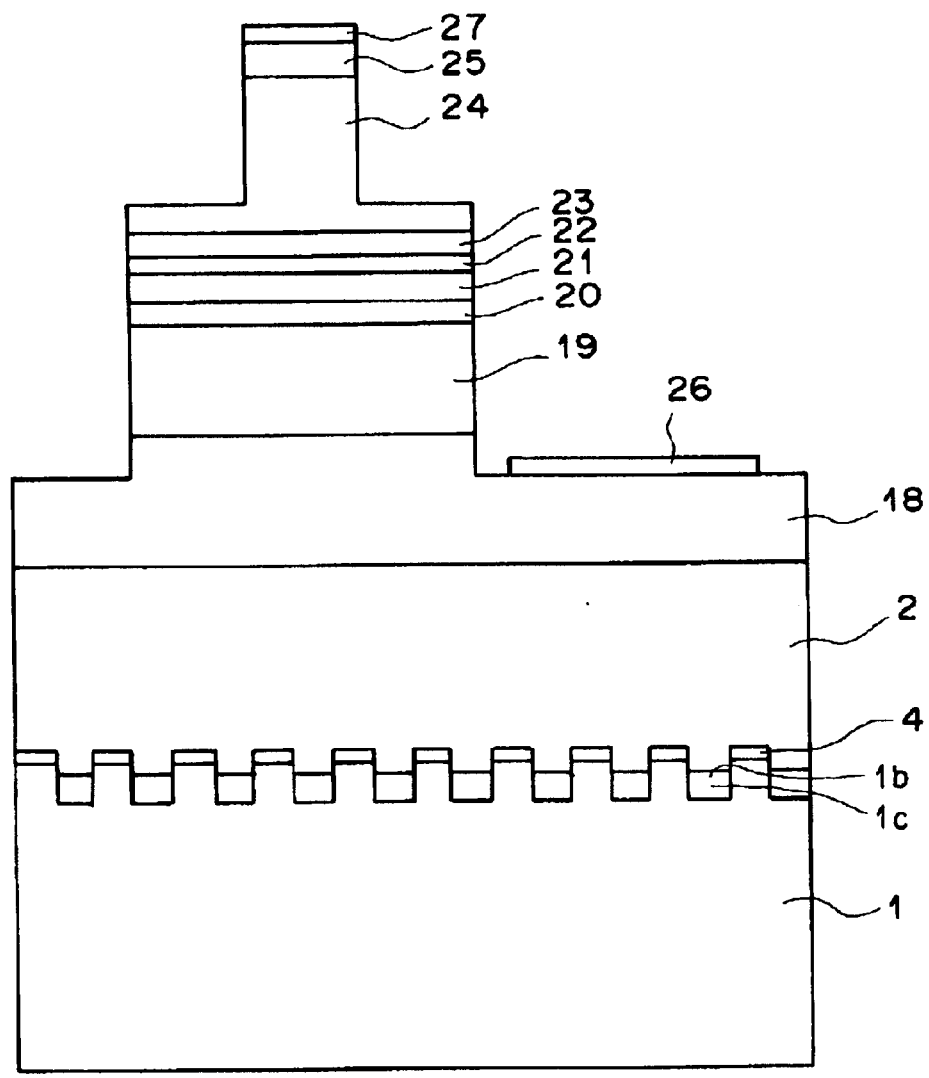
FIG. 11 is a diagrammatic cross-sectional view of a semiconductor laser device using the substrate as the first embodiment of the present invention.

The concrete example II is a semiconductor laser device as a concrete example of a semiconductor element which is formed on the substrate as the concrete example I. FIG. 11 is a diagrammatic cross-sectional view of the semiconductor laser device using the substrate as the third embodiment of the present invention.

As explained before, the substrate as the concrete example I used in the semiconductor laser device as the concrete example II is constituted by the SiC base substrate 1 having the plurality of minute pits 1b on its upper surface, and the low-temperature GaN buffer layer 4 and the GaN layer 2 which are formed on the upper surface of the base substrate 1, where the plurality of minute pits 1b are partially filled with the GaN layer 2 so that the plurality of spaces 1c are left in the plurality of minute pits 1b.

As illustrated in FIG. 11, an n-type GaN contact layer 18, an n-type $Ga_{1-z1}Al_{z1}N$ (2.5 nm)/GaN (2.5 nm) superlattice cladding layer 19, an n-type $Ga_{1-z2}Al_{z2}N$ optical waveguide layer 20, an $In_{x2}Ga_{1-x2}N$ (Si-doped) /$In_{x1}Ga_{1-x1}N$ multiple-quantum-well active layer 21 (0.5>x1>x2≧0), a p-type $Ga_{1-z3}Al_{z3}N$ carrier blocking layer 22 (z1≧z3>z2≧0), a p-type $Ga_{1-z2}Al_{z2}N$ optical waveguide layer 23, a p-type $Ga_{1-z1}Al_{z1}N$ (2.5 nm)/GaN (2.5 nm) superlattice cladding layer 24 (0<z1<), and a p-type GaN contact layer 25 are formed on the GaN layer 2 in the above substrate.

Subsequently, a first $SiO_2$ insulation film (not shown) and a first resist layer (not shown) are formed over the layered structures formed as above, and regions of the first resist layer and the first $SiO_2$ insulation film other than first stripe regions of the first resist layer and the first $SiO_2$ insulation film having a width of about 30 micrometers are removed by conventional lithography. Then, the regions of the layered structures on both sides of the first stripe regions are etched to a mid-thickness of the p-type $Ga_{1-z1}Al_{z1}N$ (2.5 nm)/GaN (2.5 nm) superlattice cladding layer 24 by selective etching using RIE, where the thickness of the remaining superlattice cladding layer 24 is determined so as to realize an index-guided structure. Thereafter, the remaining regions of the first resist layer and the first $SiO_2$ insulation film are removed.

Next, a second $SiO_2$ insulation film (not shown) and a second resist layer (not shown) are formed over the layered structures formed as above, regions of the second resist layer and the second $SiO_2$ insulation film other than second stripe regions of the second resist layer and the second $SiO_2$ insulation film are removed, where the second stripe regions are located corresponding to the first stripe regions and 20 micrometers wider than the first stripe regions on each side of the first stripe regions. Then, the regions of the layered structures on both sides of the second stripe regions are etched by RIE until the n-type GaN contact layer 18 is exposed.

Thereafter, by using conventional lithography, an n electrode 26 made of Ti/Al is formed on the n-type GaN contact layer 18, and a p electrode 27 made of Ni/Au is formed on the remaining stripe region of the p-type GaN contact layer 25. Subsequently, the substrate is polished and cleaved so as to form resonator surfaces. Then, a high reflectance coating and a low reflectance coating are applied to the resonator surfaces produced by the cleavage, and the above layered structure is formed into a chip of a semiconductor laser device.

The present inventors have confirmed that the above semiconductor laser device having a wide stripe structure formed on the low-defect GaN layer 2 is highly reliable even in high output power operation.

Concrete Example III

The concrete example III is a concrete example of the substrate as the third embodiment of the present invention illustrated in FIGS. 5 and 6.

First, by organometallic vapor phase epitaxy, a low-temperature GaN layer 32A having a thickness of about 20 nm is formed on a (0001) C face of a main portion 30 made of sapphire at 500° C., and then a GaN layer 32B having a thickness of about 1 micrometer is formed at 1,050° C. Thus, a base substrate 31 is obtained.

Next, an aluminum film having a thickness of about 0.5 micrometers is formed on the GaN layer 32B of the base substrate 31 by EB (electron beam) evaporation. Then, the GaN layer 32B on which the aluminum film is formed and a counter electrode made of carbon are fixed with a gap of 10 mm in a 15% sulfuric acid solution, the temperature is maintained at about 10° C., and a voltage of about 15 V is applied between the GaN layer 32B having the aluminum film as an anode and the carbon counter electrode as a cathode, so that a porous anodic alumina film 34 having a plurality of minute pores is formed on the base substrate 31 as illustrated in FIG. 6A, where the plurality of minute pores have diameters of about 30 nm and a total area occupying about 70% of the entire area of the porous anodic alumina film 34. Thereafter, a plurality of minute pits 31b and a plurality of unetched portions 31a are produced on the surface of the GaN layer 32B by etching the surface of the GaN layer 32B with mixture gas of $CHF_3$ and oxygen by RIE, as illustrated in FIG. 6B, where the depths of the plurality of minute pits 31b are about 1 micrometer.

Subsequently, the porous anodic alumina film 34 is removed with a NaOH solution, and a GaN layer 33 is formed on the plurality of unetched portions 31a by organometallic vapor phase epitaxy, where crystal growth in the lateral directions is continued at 1,050° C. until the surface of the GaN layer 33 becomes even. Thus, a substrate for use in a semiconductor element is obtained as illustrated in FIG. 6C.

Concrete Example IV

The concrete example IV is another concrete example of the substrate as the third embodiment of the present invention illustrated in FIGS. 5 and 6.

First, a low-temperature GaN layer 32A having a thickness of 30 nm is formed on a (0001) C face of a main portion 30 made of sapphire at 500° C., and then a GaN layer 32B having a thickness of 2 micrometer is formed. Thus, a base substrate 31 is obtained.

Next, an aluminum film having a thickness of about 0.5 micrometers is formed on the GaN layer 32B (the upper portion 32) of the base substrate 31 by EB (electron beam) evaporation. Then, the base substrate 31 on which the aluminum film is formed and a counter electrode made of carbon are fixed with a gap of 10 mm in a 15% sulfuric acid solution, the temperature is maintained at about 10° C., and a voltage of about 15 V is applied between the base substrate 31 having the aluminum film as an anode and the carbon counter electrode as a cathode, so that a porous anodic alumina film 34 having a plurality of minute pores is formed on the GaN layer 32B (the upper portion 32) of the base substrate 31 as illustrated in FIG. 6A, where the plurality of minute pores have diameters of about 30 nm and a total area occupying about 70% of the entire area of the porous anodic alumina film 34. Thereafter, a plurality of minute pits 31b and a plurality of unetched portions 31a are produced on the surface of the GaN layer 32B by etching the surface of the base GaN layer 32B in chlorine gas by ECR (electron cyclotron resonance) etching, as illustrated in FIG. 6B, where the depths of the plurality of minute pits 31b are about 1 micrometer.

Subsequently, the porous anodic alumina film 34 and the unanodized aluminum film under the porous anodic alumina film 34 are removed with a 70° C. phosphoric acid solution, and a GaN layer 33 is formed on the plurality of unetched portions 31a by organometallic vapor phase epitaxy, where crystal growth in the lateral directions is continued at 1,050° C. until the surface of the GaN layer 33 becomes even. Thus, a substrate for use in a semiconductor element is obtained as illustrated in FIG. 6C.

The present inventors have measured the etch pit density of the substrate formed as above. In the measurement, the etch pit density is counted after the substrate is dipped in an etching solution. The measured etch pit density of the substrate as the concrete example IV is $10^6$ to $10^7/cm^2$, which is three to four orders of magnitude smaller than the etch pit densities (about $10^{10}/cm^2$) of the substrates produced by the conventional production process.

Concrete Example V

Figure 12:
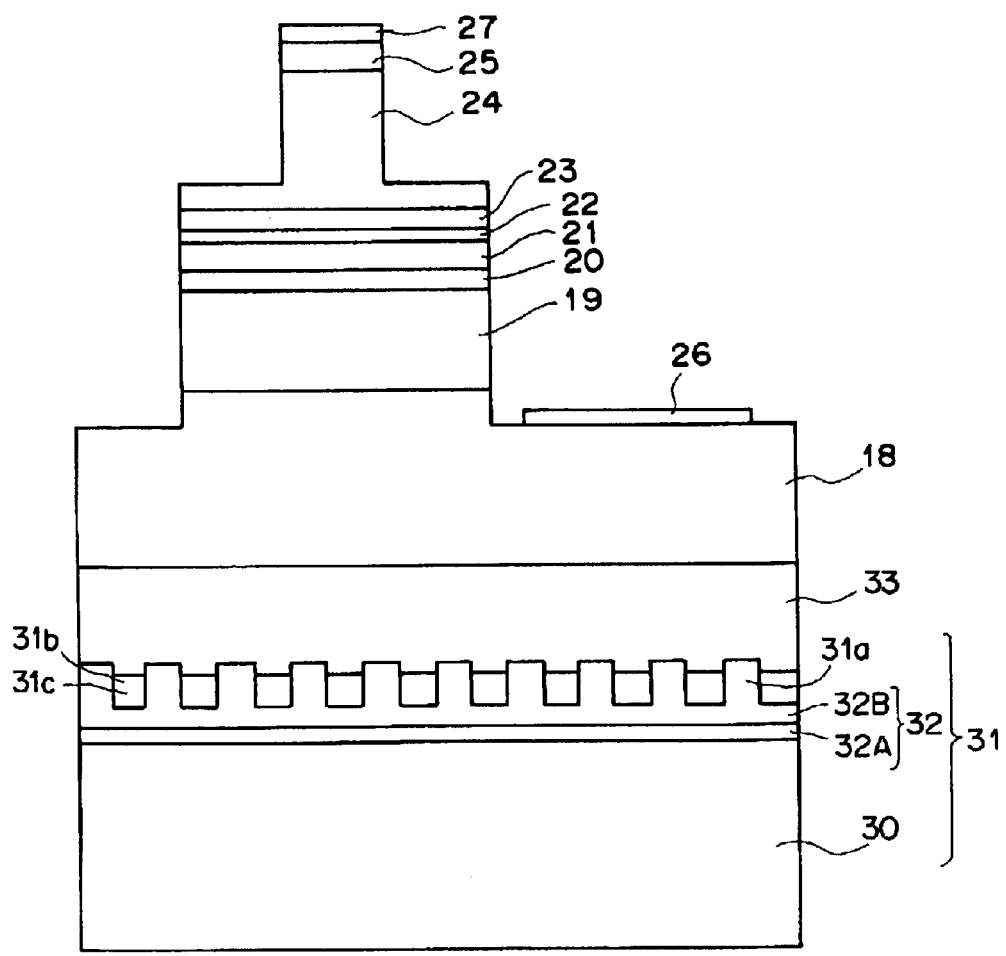
FIG. 12 is a diagrammatic cross-sectional view of a semiconductor laser device using the substrate as the third embodiment of the present invention.

The concrete example V is a semiconductor laser device as a concrete example of a semiconductor element which is formed on the substrate as the concrete example IV. FIG. 12 is a diagrammatic cross-sectional view of a semiconductor laser device using the substrate as the third embodiment of the present invention.

As explained before, the substrate as the concrete example IV, which is used in the semiconductor laser device as the concrete example V, is constituted by the base substrate 31 and the upper GaN layer 33 formed on the base substrate 31 by crystal growth, where the base substrate 31 comprises the main portion 30, the low-temperature GaN layer 32A, and the GaN layer 32B on which the plurality of minute pits 31b are formed by using the porous anodic alumina film, and the plurality of minute pits 31b are partially filled with the upper GaN layer 33 so that the plurality of spaces 31c are left in the plurality of minute pits 31b.

As illustrated in FIG. 12, an n-type GaN contact layer 18, an n-type $Ga_{1-z1}Al_{z1}N$ (2.5 nm)/GaN (2.5 nm) superlattice cladding layer 19, an n-type $Ga_{1-z2}Al_{z2}N$ optical waveguide layer 20, an $In_{x2}Ga_{1-x2}N$ (Si-doped) /$In_{x1}Ga_{1-x1}N$ multiple-quantum-well active layer 21 ($0.5>x1>x2\geqq0$), a p-type $Ga_{1-z3}Al_{z3}N$ carrier blocking layer 22 ($z1\geqq z3>z2\geqq0$), a p-type $Ga_{1-z2}Al_{z2}N$ optical waveguide layer 23, a p-type $Ga_{1-z1}Al_{z1}N$ (2.5 nm)/GaN (2.5 nm) superlattice cladding layer 24 ($0<z1<1$), and a p-type GaN contact layer 25 are formed on the GaN layer 33 in the above substrate.

Subsequently, a first $SiO_2$ insulation film (not shown) and a first resist layer (not shown) are formed over the layered structures formed as above, and regions of the first resist layer and the first $SiO_2$ insulation film other than first stripe regions of the first resist layer and the first $SiO_2$ insulation film having a width of about 30 micrometers are removed by conventional lithography. Then, the regions of the layered structures on both sides of the first stripe regions are etched to a mid-thickness of the p-type $Ga_{1-z1}Al_{z1}N$ (2.5 nm)/GaN (2.5 nm) superlattice cladding layer 24 by selective etching using RIE, where the thickness of the remaining superlattice cladding layer 24 is determined so as to realize an index-guided structure. Thereafter, the remaining regions of the first resist layer and the first $SiO_2$ insulation film are removed.

Next, a second $SiO_2$ insulation film (not shown) and a second resist layer (not shown) are formed over the layered structures formed as above, regions of the second resist layer and the second $SiO_2$ insulation film other than second stripe regions of the second resist layer and the second $SiO_2$ insulation film are removed, where the second stripe regions are located corresponding to the first stripe regions and 20 micrometers wider than the first stripe regions on each side of the first stripe regions. Then, the regions of the layered structures on both sides of the second stripe regions are etched by RIE until the n-type GaN contact layer 18 is exposed.

Thereafter, by using conventional lithography, an n electrode 26 made of Ti/Al is formed on the n-type GaN contact layer 18, and a p electrode 27 made of Ni/Au is formed on the remaining stripe region of the p-type GaN contact layer 25. Subsequently, the substrate is polished and cleaved so as to form resonator surfaces. Then, a high reflectance coating and a low reflectance coating are applied to the resonator surfaces produced by the cleavage, and the above layered structure is formed into a chip of a semiconductor laser device.

The present inventors have confirmed that the above semiconductor laser device having a wide stripe structure formed on the low-defect GaN layer 33 is highly reliable even in high output power operation.

Concrete Example VI

The concrete example VI is an concrete example of the substrate as the sixth embodiment of the present invention illustrated in FIGS. 10A. 10B, and 10C.

First, a low-temperature GaN layer 32A having a thickness of 30 nm is formed on a (0001) C face of a main portion 30 made of sapphire at 500° C., and then a GaN layer 32B having a thickness of about 2 micrometers is formed on the low-temperature GaN layer 32A at a low pressure of $1.33 \times 10^4$ Pa. Thus, a base substrate 31'is obtained.

Next, an aluminum film having a thickness of about 0.5 micrometers is formed on the GaN layer 32B'(the upper portion 32') of the base substrate 31' by EB (electron beam) evaporation. Then, the base substrate 31' on which the aluminum film is formed and a counter electrode made of carbon are fixed with a gap of 10 mm in a 15% sulfuric acid solution, the temperature is maintained at about 10° C., and a voltage of about 15 V is applied between the base substrate 31' having the aluminum film as an anode and the carbon counter electrode as a cathode. Thus, the present inventors have obtained a porous anodic alumina film 34 having a plurality of minute pores 34b as illustrated in FIG. 10A, where the plurality of minute pores 34b have a diameter of about 15 nm and a pore density of $500 \times 10^9 / cm^2$ and being formed on the GaN layer 32B' (the upper portion 32') of the base substrate 31'. In addition, an alumina layer and an unanodized aluminum layer located under the alumina layer exist at the bottom of each of the plurality of minute pits 34b.

Next, the alumina layer at the bottom of each of the plurality of minute pits 34b, the unanodized aluminum layer located under the alumina layer, and a portion of the GaN layer 32B' located under the unanodized aluminum layer are etched in chlorine gas by ECR etching using the porous anodic alumina film 34 as a mask so as to form a minute pit 31b' in the GaN layer 32B' under the the bottom of each of the plurality of minute pits 34b. At this time, the etching condition is adjusted so that the etching rate of the porous anodic alumina film is higher than the etching rate of the GaN layer 32B'. The etching is continued until the alumina layer at the bottom of each of the plurality of minute pits 34b and the unanodized aluminum layer located under the alumina layer are completely removed, and the minute pit 31b' is formed in the GaN layer 32B'. Thus, a plurality of minute pits 31b' and a plurality of unetched portions 31a' are formed on the surface of the GaN layer 32B' as illustrated in FIG. 10B.

Thereafter, a GaN layer 39 is formed on the plurality of unetched portions 31a' by organometallic vapor phase epitaxy, where crystal growth in the lateral directions is continued at 1,050° C. until the surface of the GaN layer 39 becomes even. The depths of the plurality of minute pits 31b' are determined so that the plurality of minute pits 31b' are fully filled with the upper GaN layer 39 during the growth of the upper GaN layer 39. Thus, a substrate for use in a semiconductor element is obtained as illustrated in FIG. 10C.

The present inventors have measured the etch pit density of the substrate formed as above. In the measurement, the etch pit density is counted after the substrate is dipped in an etching solution. The measured etch pit density of the substrate as the concrete example VI is $10^6$ to $10^7/cm^2$, which is three to four orders of magnitude smaller than the etch pit densities (about $10^{10}/cm^2$) of the substrates produced by the conventional production process.

Concrete Example VII

Figure 13:
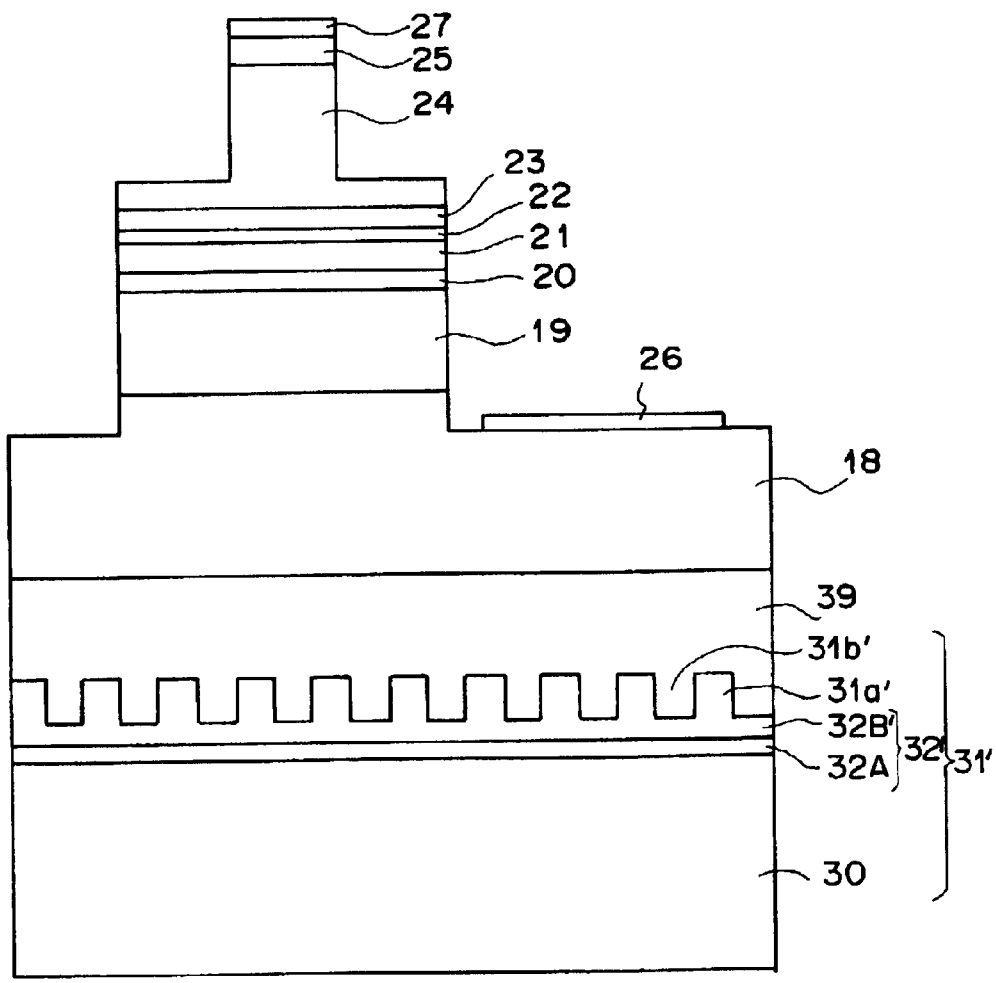
FIG. 13 is a diagrammatic cross-sectional view of a semiconductor laser device using the substrate as the sixth embodiment of the present invention.

The concrete example VII is a semiconductor laser device as a concrete example of a semiconductor element which is formed on the substrate as the concrete example VI. FIG. 13 is a diagrammatic cross-sectional view of a semiconductor laser device using the substrate as the sixth embodiment of the present invention.

As explained before, the substrate as the concrete example VI, which is used in the semiconductor laser device as the concrete example VII, is constituted by the base substrate 31' and the upper GaN layer 39 formed on the base substrate 31', where the base substrate 31' comprises the main portion 30, the low-temperature GaN layer 32A, and the GaN layer 32B' on which the plurality of minute pits 31b' are formed by using the porous anodic alumina film, and the plurality of minute pits 31b' are fully filled with the upper GaN layer 39.

As illustrated in FIG. 13, an n-type GaN contact layer 18, an n-type $Ga_{1-z1}Al_{z1}N$ (2.5 nm)/GaN (2.5 nm) superlattice cladding layer 19, an n-type $Ga_{1-z2}Al_{z2}N$ optical waveguide layer 20, an $In_{x2}Ga_{1-x2}N$ (Si-doped)/$In_{x1}Ga_{1-x1}N$ multiple-quantum-well active layer 21 (0.5>x1>x2≧0), a p-type $Ga_{1-z3}Al_{z3}N$ carrier blocking layer 22 (z1≧z3>z2≧0), a p-type $Ga_{1-z2}Al_{z2}N$ optical waveguide layer 23, a p-type $Ga_{1-z1}Al_{z1}N$ (2.5 nm)/GaN (2.5 nm) superlattice cladding layer 24 (0<z1<1), and a p-type GaN contact layer 25 are formed on the GaN layer 39 in the above substrate.

Subsequently, a first $SiO_2$ insulation film (not shown) and a first resist layer (not shown) are formed over the layered structures formed as above, and regions of the first resist layer and the first $SiO_2$ insulation film other than first stripe regions of the first resist layer and the first $SiO_2$ insulation film having a width of about 30 micrometers are removed by conventional lithography. Then, the regions of the layered structures on both sides of the first stripe regions are etched to a mid-thickness of the p-type $Ga_{1-z1}Al_{z1}$ N (2.5 nm)/GaN (2.5 nm) superlattice cladding layer 24 by selective etching using RIE, where the thickness of the remaining superlattice cladding layer 24 is determined so as to realize an index-guided structure. Thereafter, the remaining regions of the first resist layer and the first $SiO_2$ insulation film are removed.

Next, a second $SiO_2$ insulation film (not shown) and a second resist layer (not shown) are formed over the layered structures formed as above, regions of the second resist layer and the second $SiO_2$ insulation film other than second stripe regions of the second resist layer and the second $SiO_2$ insulation film are removed, where the second stripe regions are located corresponding to the first stripe regions and 20 micrometers wider than the first stripe regions on each side of the first stripe regions. Then, the regions of the layered structures on both sides of the second stripe regions are etched by RIE until the n-type GaN contact layer 18 is exposed.

Thereafter, by using conventional lithography, an n electrode 26 made of Ti/Al is formed on the n-type GaN contact layer 18, and a p electrode 27 made of Ni/Au is formed on the remaining stripe region of the p-type GaN contact layer 25. Subsequently, the substrate is polished and cleaved so as to form resonator surfaces. Then, a high reflectance coating and a low reflectance coating are applied to the resonator surfaces produced by the cleavage, and the above layered structure is formed into a chip of a semiconductor laser device.

Variations of Concrete Examples

Although the semiconductor laser devices as the concrete examples II, V, and VII are index-guided semiconductor laser devices having a ridge structure and a great stripe width, the substrates according to the present invention can also be used in other semiconductor elements including other semiconductor laser devices. Such semiconductor laser devices may be index-guided semiconductor laser devices having a ridge structure and a stripe width of about 1 to 2 micrometers and oscillating in a fundamental transverse mode, index-guided semiconductor laser devices having an internal index-guided structure, and index-guided semiconductor laser devices having a buried ridge structure.

The conductivity types of the semiconductor layers of the semiconductor laser device as each of the concrete examples II, V, and VII may be inverted. That is, the n-type and the p-type may be exchanged.

When the composition of the active layer is appropriately controlled, the oscillation wavelength of the semiconductor laser device as each of the concrete examples II, V, and VII can be controlled in the range of 380 to 550 nm.

What is claimed is:

1. A process for producing a substrate for use in a semiconductor element, comprising the steps of:
   (a) forming on a surface of a base substrate a porous anodic alumina film having a plurality of minute pores;
   (b) etching the surface of the base substrate by using the porous anodic alumina film as a mask so as to form a plurality of pits on the surface of the base substrate;
   (c) removing said porous anodic alumina film; and
   (d) forming a GaN layer on the surface of the base substrate by crystal growth.

2. A process according to claim 1, wherein each of said plurality of pits has a diameter of 10 to 400 nm, and the plurality of pits have a total area which corresponds to 50 to 90% of the entire surface of the base substrate.

3. A process according to claim 1, further comprising an additional step of forming as an uppermost layer a conductive GaN layer which is doped with a conductive impurity.

4. A process according to claim 1, further comprising an additional step of removing said base substrate.

5. A process according to claim 1, wherein at least a portion of the base substrate including said surface is made of one of GaN, sapphire, SiC, ZnO, LiGaO$_2$, LiAlO$_2$, ZrB$_2$, GaAs, GaP, Ge, and Si.

6. A process for producing a substrate for use in a semiconductor element, comprising the steps of:
   (a) forming on a surface of a base substrate a porous anodic alumina film having a plurality of minute pores;
   (b) etching the surface of the base substrate by using the porous anodic alumina film as a mask so that a plurality of pits are formed on the surface of the base substrate and the porous anodic alumina film is etched off; and
   (c) forming a GaN layer on the surface of the base substrate by crystal growth.

7. A process according to claim 6, wherein each of said plurality of pits has a diameter of 10 to 400 nm, and the plurality of pits have a total area which corresponds to 50 to 90% of the entire surface of the base substrate.

8. A process according to claim 6, further comprising an additional step of forming as an uppermost layer a conductive GaN layer which is doped with a conductive impurity.

9. A process according to claim 6, further comprising an additional step of removing said base substrate.

10. A process according to claim 6, wherein at least a portion of the base substrate including said surface is made of one of GaN, sapphire, SiC, ZnO, LiGaO$_2$, LiAlO$_2$, ZrB$_2$, GaAs, GaP, Ge, and Si.

11. A semiconductor element comprising:
    a substrate; and
    semiconductor layers formed on the substrate;
    wherein said substrate includes,
      a base substrate having a surface on which a plurality of pits are formed by etching using a porous anodic alumina film having a plurality of pores as a mask, and
      a GaN layer formed by crystal growth on said surface of the base substrate.

12. A semiconductor element according to claim 11, wherein each of said plurality of pits has a diameter of 10 to 400 nm, and the plurality of pits have a total area which corresponds to 50 to 90% of the entire surface of the base substrate.

13. A semiconductor element according to claim 11, wherein said substrate further includes as an uppermost layer a conductive GaN layer which is doped with a conductive impurity.

14. A semiconductor element according to claim 11, wherein at least a portion of the base substrate including said surface is made of one of GaN, sapphire, SiC, ZnO, LiGaO$_2$, LiAlO$_2$, ZrB$_2$, GaAs, GaP, Ge, and Si.

15. A semiconductor element according to claim 11, wherein said GaN layer formed on said surface of the base substrate so that said plurality of pits are partially filled with the GaN layer and a plurality of spaces are left in the plurality of pits.

16. A semiconductor element according to claim 11, wherein said GaN layer formed on said surface of the base substrate so that said plurality of pits are fully filled with the GaN layer.

17. A semiconductor element comprising:
    a substrate; and
    semiconductor layers formed on the substrate;
    wherein said substrate is produced by forming a plurality of pits on a surface of a base substrate by etching using a porous anodic alumina film having a plurality of pores as a mask, forming a GaN layer by crystal growth on said surface of the base substrate, and removing said base substrate so as to leave said GaN layer as said substrate.

18. A semiconductor element according to claim 17, wherein each of said plurality of pits has a diameter of 10 to 400 nm, and the plurality of pits have a total area which corresponds to 50 to 90% of the entire surface of the base substrate.

19. A semiconductor element according to claim 17, wherein at least a portion of the base substrate including said surface is made of one of GaN, sapphire, SiC, ZnO, LiGaO$_2$, LiAlO$_2$, ZrB$_2$, GaAs, GaP, Ge, and Si.

20. A semiconductor element comprising:
    a substrate; and
    semiconductor layers formed on the substrate;
    wherein said substrate is produced by forming at least one first GaN layer on the base substrate, forming on said at least one first GaN layer a second GaN layer which is doped with a conductive impurity, and removing said base substrate and said at least one first GaN layer so as to leave said second GaN layer as the substrate, and
    before each of said at least one first GaN layer is formed on a surface of one of the base substrate and the at least one first GaN layer located under said each of said at least one first GaN layer, a plurality of pits are formed on said surface by etching using a porous anodic alumina film having a plurality of pores as a mask.

21. A semiconductor element according to claim 20, wherein each of said plurality of pits has a diameter of 10 to 400 nm, and the plurality of pits have a total area which corresponds to 50 to 90% of the entire surface of the base substrate.

22. A semiconductor element according to claim 20, wherein at least a portion of the base substrate including said surface is made of one of GaN, sapphire, SiC, ZnO, LiGaO$_2$, LiAlO$_2$, ZrB$_2$, GaAs, GaP, Ge, and Si.

23. A substrate for use in a semiconductor element, comprising:
   a base substrate having a surface on which a plurality of pits are formed by etching using a porous anodic alumina film; and
   a GaN layer formed on said surface of the base substrate so that said plurality of pits are partially filled with the GaN layer and a plurality of spaces are left in the plurality of pits.

24. A substrate for use in a semiconductor element, comprising:
   a base substrate having a surface on which a plurality of pits are formed by etching using a porous anodic alumina film; and
   a GaN layer formed on said surface of the base substrate so that said plurality of pits are fully filled with the GaN layer.

* * * * *